(12) United States Patent
Yamaoka

(10) Patent No.: US 6,825,673 B1
(45) Date of Patent: Nov. 30, 2004

(54) METHOD AND APPARATUS FOR CIRCUIT BOARD CONTINUITY TEST, TOOL FOR CONTINUITY TEST, AND RECORDING MEDIUM

(75) Inventor: Shuji Yamaoka, Fukuyama (JP)

(73) Assignee: OHT Inc., Hiroshima (JP)

( * ) Notice: Subject to any disclaimer, the term of this patent is extended or adjusted under 35 U.S.C. 154(b) by 0 days.

(21) Appl. No.: 10/030,104

(22) PCT Filed: May 19, 2000

(86) PCT No.: PCT/JP00/03204
§ 371 (c)(1),
(2), (4) Date: May 23, 2002

(87) PCT Pub. No.: WO01/88556
PCT Pub. Date: Nov. 22, 2001

(51) Int. Cl.[7] .................................................. H01H 31/02
(52) U.S. Cl. ......................................... 324/537; 324/658
(58) Field of Search ..................................... 324/511, 527, 324/528, 632, 633, 655, 668, 682, 686, 537

(56) References Cited

U.S. PATENT DOCUMENTS

| | | | | |
|---|---|---|---|---|
| 5,254,953 A | * | 10/1993 | Crook et al. .................. | 324/538 |
| 5,621,327 A | * | 4/1997 | Chiang et al. ................. | 324/537 |
| 5,696,451 A | * | 12/1997 | Keirn et al. ................... | 324/687 |
| 6,027,500 A | * | 2/2000 | Buckles et al. ................ | 606/34 |
| 6,111,414 A | * | 8/2000 | Chatterjee et al. ............ | 324/633 |
| 6,201,398 B1 | * | 3/2001 | Takada .......................... | 324/537 |
| 6,650,126 B1 | * | 11/2003 | Indihar .......................... | 324/658 |

FOREIGN PATENT DOCUMENTS

| | | |
|---|---|---|
| JP | 60-117744 | 6/1985 |
| JP | 62-257070 | 11/1987 |
| JP | 04-244976 | 9/1992 |
| JP | 07-146323 | 6/1995 |
| JP | 10-115653 | 5/1998 |
| JP | 2000-155149 | 6/2000 |
| JP | 2000-171500 | 6/2000 |

OTHER PUBLICATIONS

Search Report dated Jul. 11, 2000, PCT/JP00/03204.

* cited by examiner

*Primary Examiner*—Anjan Deb
*Assistant Examiner*—Walter Benson
(74) *Attorney, Agent, or Firm*—Westerman, Hattori, Daniels & Adrian, LLP

(57) ABSTRACT

The present invention provides an apparatus and method for inspecting electrical continuity of a circuit board, capable of decreasing the impedance in a current path as an inspection object to achieve enhanced SN ratio. A coupling capacitance is formed at one of terminals of a pattern wire on a board as an inspection object in a non-contact manner, and an inductance (450) and a lead wire are connected to this capacitance. An AC inspection signal is applied to the other terminal through the lead wire in a contact manner. A resonance circuit is defined by the capacitance, inductance and pattern wire, and thereby an output signal can be detected with lowering the impedance.

22 Claims, 11 Drawing Sheets

METHOD AND APPARATUS FOR CIRCUIT BOARD CONTINUITY TEST, TOOL FOR CONTINUITY TEST, AND RECORDING MEDIUM

TECHNICAL FIELD

The present invention relates to an apparatus and method for inspecting electrical continuity of a circuit board, for example, having a fine wiring pattern. The present invention also relates to a jig for use in such an inspection.

BACKGROUND ART

As a system for inspecting a circuit board, there have been known a pin-contact system and a non-contact system. As shown in FIG. 1, the pin-contact system is configured to inspect electrical continuity between both ends of a conductive pattern as an inspection object by bringing two pin probes directly into contact with the ends, respectively, and applying a current to one of the pin probes so as to determine a resistance value of the conductive pattern from a detected voltage at the other pin probe.

This pin-contact system has an advantage of a high signal-to-noise (SN) ratio because of the pin probes contacted directly with the conductive pattern.

On the other hand, in case of inspecting a fine-pitch board, it is fundamentally difficult to set up the pin probes only to a conductive pattern as an inspection object, and it is increasingly hard to secure an adequate positioning for bringing the pin probes into contact with the aimed pattern. Due to the necessity for keeping in the contact state, it is also difficult to maintain the initial accuracy of the pin probes themselves, resulting in undesirably increased running cost arising from replacements of the pin probes.

As shown in FIG. 2, the other non-contact/contact combined system is configured to apply an inspection signal including an alternating current (AC) component with making one pin probe contact directly with one end of a conductive pattern as an inspection object (or through a capacitive coupling in a non-contact manner) and detect the inspection signal through a capacitive coupling at the other end.

The non-contact/contact combined system allows at least one of the pin probes not to be contacted with a pattern wire or the conductive pattern. This provides a relatively wide acceptable range of positioning accuracy for the pin probe, which makes it possible to use the pin probe commonly for a plurality of pattern wires, and thereby to reduce the number of pin probes. Furthermore, since the pin prove is free from any wear, the combined system is effective for a board with a fine wiring pattern.

However, the non-contact/contact combined system has a small value of coupling capacitance and a high impedance (from several MΩ to several GΩ). Thus, this system cannot detect any defective portion having a resistance ranging from about 10Ω to about 100Ω.

As a result, due to the property including high impedance despite having many advantages, the non-contact/contact combined system has been actually implemented only for a board with an extremely narrow pitch not to allow pin probes to be adequately set up thereon. Thus, the required high accuracy in the pin probes and a jig thereof has been an obstacle in the effort to facilitate the cost reduction in the non-contact/contact combined system.

It is therefore an object of the present invention to provide a continuity inspection apparatus capable of inspecting any electrical conductivity not only under a high resistance but also under a low resistance by making a capacitance provided in the non-contact system generate a resonance in oscillations of a circuit formed on a board to reduce the impedance of the circuit.

DISCLOSURE OF THE INVENTION

According to the present invention, an electrode is disposed close to one of ends of a pattern as an inspection object to form a capacitance C between the end and the electrode, and an inductive element L is connected to the capacitance C. An inspection signal (frequency f) including an AC component is applied to the other end of the pattern wire through a pin probe.

When the impedance of a resonance circuit is reduced by appropriately adjusting the value L, or when the value L is adjusted, for example, so as to satisfy the following formula (1), $$2fL = (1/2)fC \qquad (1)$$

the following formula is derived from the formula (1).

$$L = (1/4^2) \times f^2 \times C \qquad (2)$$

In other words, the impedance of the circuit can be zero by adjusting the value L in the formula (2), and then an output voltage V exhibits a maximum value. Given that $V_R$ is the output voltage V in case of using a reference circuit board (i.e. a circuit board in which no disconnection has been verified) and applying a resonance frequency $f_R$ thereto, the output voltage $V_x$ in case of using an actual circuit board as an inspection object would indicate a larger value because the circuit is expected to come close to a resonance state.

As one example, when the value of the coupling capacitance is 10 fF, the relationship between the working frequency $f_R$ and the inductive element L which can cooperatively generate the resonance state is shown as follows, when $f_R$=10 kHz, L=25.3 kH, or
when $f_R$=10 MHz, L=25 mH, or
when $f_R$=50 MHz, L=1 mH, or
when $f_R$=100 MHz, L=250 mH.

A parameter for controlling resonance includes the frequency f of the input inspection signal, the coupling capacitance C, and the inductance L of the inductive element. For example, when the electrode has a fixed size and the measuring is carried out with keeping the distance between the electrode and the pattern constant, the capacitance C would be, for example, about 15 fF. Then, by adjusting the value of the inductive element L in the range of about 250 mH to about 1 mH, and providing an AC signal source having a frequency ranging from about 50 MHz to about 100 MHz, the impedance can be substantially zero.

Based on the above knowledge, according to a first aspect of the present invention, there is provided a continuity inspection apparatus for inspecting electrical continuity between first and second terminals of a pattern wire formed on a board, comprising:

capacitive coupling means to be capacitively coupled with the first terminal in a non-contact manner to provide a coupling capacitance therebetween;

an inductive element connected to the capacitive coupling means to form a resonance circuit in conjunction with the capacitance yielded by the capacitive coupling means;

a first lead wire connected to the inductive element;

probe means connected to a second lead wire and to be contacted with the second terminal;

signal inputting means for inputting an inspection signal including an AC component into one of the first and second lead wires; and signal detecting means for detecting an output of the inspection signal at the other of the first and second lead wires.

The arrangement of the inductive element may be variously modified. Thus, according to a second aspect of the present invention, there is provided a continuity inspection apparatus for inspecting electrical continuity between first and second terminals of a pattern wire formed on a board, comprising:

probe means to be directly contacted with the first terminal;

an inductive element connected to the probe means;

a first lead wire connected to the inductive element;

capacitive coupling means connected to a second lead wire and to be capacitively coupled with the second terminal in a non-contact manner to provide a coupling capacitance therebetween;

signal inputting means for inputting an inspection signal including an AC component into one of the first and second lead wires; and signal detecting means for detecting an output of the inspection signal at the other of the first and second lead wires.

The coupling capacitance may be formed at both the first and second terminals. Thus, according to a third aspect of the present invention, there is provided a continuity inspection apparatus for inspecting electrical continuity between first and second terminals of a pattern wire formed on a board, comprising:

first capacitive coupling means to be capacitively coupled with the first terminal in a non-contact manner to provide a coupling capacitance therebetween;

an inductive element connected to the first capacitive coupling means to form a resonance circuit in conjunction with the capacitance yielded by the first capacitive coupling means;

a first lead wire connected to the inductive element;

second capacitive coupling means connected to a second lead wire and to be capacitively coupled with the second terminal in a non-contact manner to provide coupling capacitance therebetween;

signal inputting means for inputting an inspection signal including an AC component into one of the first and second lead wires; and signal detecting means for detecting an output of the inspection signal at the other of the first and second lead wire.

The above object of the present invention can also be achieved according to a fourth aspect of the present invention which provides a continuity inspection jig having first and second terminal groups spaced apart each other with leaving a given distance therebetween. The continuity inspection jig comprising:

a lead wire connected to all or part of first ends of the first terminal group so as to apply a continuity inspection signal thereto;

contact sections provided respectively at all or part of second ends of the first terminal group and to be contacted with a board as an inspection object;

one or more inductive elements connected to all or part of the second terminal group; and electrodes provided respectively at all or part of the second ends of the second terminal group and for forming a coupling capacitance without any contact with a wiring pattern of the board as an inspection object.

The above object can also be achieved according to a fifth aspect of the present invention, which provides a continuity inspection method for inspecting electrical continuity between first and second terminals of a pattern wire formed on a board, comprising the steps of:

positioning a given electrode close to the first terminal to form a coupling capacitance, and connecting a given inductive element to the electrode, followed by connecting a first lead wire to the inductive element and connecting a second lead wire to the second terminal, so as to form a resonance circuit by the first lead wire, inductive element, electrode, coupling capacitance, first terminal, pattern wire, second terminal and second lead wire;

applying an inspection signal including an AC component to one of the first and second lead wires; and detecting an output of the inspection signal at the other of the first and second lead wires.

In order to achieve the same object, according to a sixth aspect of the present invention, there is provided a continuity inspection method for inspecting electrical continuity between first and second terminals of a pattern wire formed on a board, comprising the steps of:

bringing a first lead wire directly into contact with the first terminal through an inductive element, and capacitively coupling a second lead wire with the second terminal in a non-contact manner to provide a coupling capacitance therebetween, so as to form a resonance circuit by the first lead wire, inductive element, first terminal, pattern wire, second terminal, electrode, coupling capacitance and second lead wire;

applying an inspection signal including an AC component to one of the first and second lead wires; and detecting an output of the inspection signal at the other of the first and second lead wires.

In order to achieve the same object, according to a seventh aspect of the present invention, there is provided a continuity inspection method for inspecting electrical continuity between first and second terminals of a pattern wire formed on a board, comprising the steps of:

capacitively coupling an inductive element connected to a first lead wire with the first terminal through a first electrode in a non-contact manner, and capacitively coupling a second lead wire with the second terminal through a second electrode in a non-contact manner, so as to form a resonance circuit by the first lead wire, inductive element, first electrode, coupling capacitance, first terminal, pattern wire, second terminal, second electrode, coupling capacitance and second lead wire;

applying an inspection signal including an AC component to one of the first and second lead wires; and detecting an output of the inspection signal at the other of the first and second lead wires.

Comparing the above construction with a conventional example having only a coupling capacitance, in case of no inductance L, for example, given that the coupling capacitance C is 10 fF and the working frequency is 10 kHz, the output impedance of the circuit is calculated as follows.

$$1/(2fC) = 1/(2 \times 3.14 \times 10^3 \times 10^{-15})$$
$$= 1.6 \, G\Omega$$

Thus, it is almost impossible to measure a resistance of the pattern. Given that the frequency f is 100 MHz, the impedance can be reduced as follows.

$$1/(2 \times 3.14 \times 10^6 \times 10^{-15}) = 159 \, k\Omega$$

However, in view of cost performance, it is impractical to increase the frequency up to such a value. That is, it is extremely important to select an optimum value of frequency.

Thus, in one embodiment of the present invention, the above method may further comprise the step of; previous to the step of applying an inspection signal, determining a resonance frequency for a pattern wire between first and second terminals of a given reference board by applying an inspection signal to the reference board while changing the frequency of the inspection signal, and in the step of applying an inspection signal, applying the inspection signal to one of the first and second lead wires with using said determined resonance frequency as a frequency thereof.

It is necessary to define the allowable changing range of the frequency in advance. Particularly, one embodiment of the present invention may include the step of; in the step of determining a resonance frequency, changing the frequency of the inspection signal for the reference board within a given range having a center frequency defined by a standard frequency determined based on the constant of the inductive element.

If the difference between the reference board and an actual board as an inspection object comes up, an apparent difference can be caused in the detected signal. In order to compensate this error, one embodiment of the present invention may include the step of; in the step of applying an inspecting signal, changing the frequency of the inspection signal for the board as an inspection object within a given range having a center frequency defined by the frequency determined in the step of determining a resonance frequency.

BEST MODE FOR CARRYING OUT THE INVENTION

Figure 1:
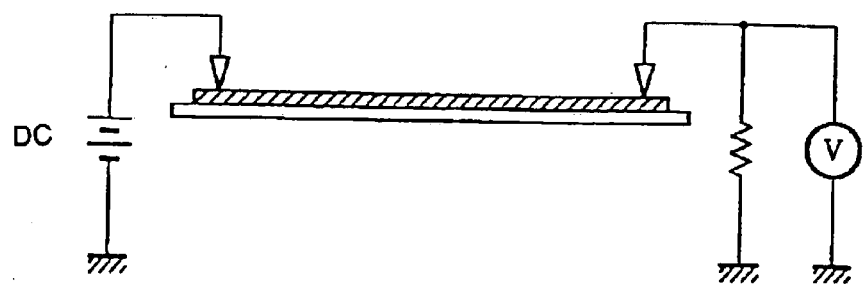
FIG. 1 illustrates a theoretical construction of a conventional contact type inspection apparatus.
Figure 2:
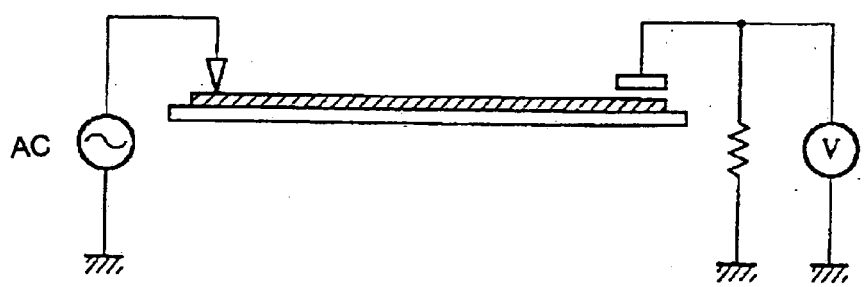
FIG. 2 illustrates a theoretical construction of a conventional non-contact type inspection apparatus.
Figure 3:
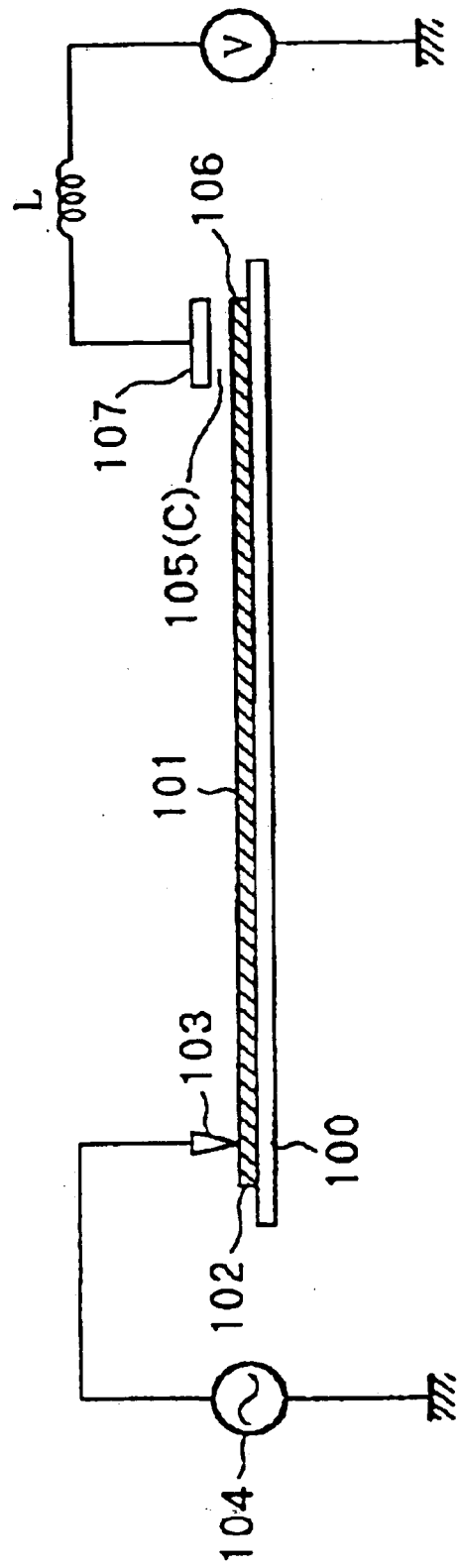
FIG. 3 illustrates a theoretical construction of an inspection apparatus according to an embodiment of the present invention.

FIG. 3 is an explanatory view of an operational theory of a preferred embodiment of the present invention.

The reference number 100 indicates a circuit board as an inspection object, and a pattern wire 101 is linearly provided on the surface of the circuit board 100. The pattern wire 101 has two ends 102 and 106, and the distance between the ends 102 and 106 and a pitch are theoretically insignificant. A pin probe 103 is contacted with the end 102 of the pattern 101 (the probe 103 may be theoretically capacitively coupled with the end 102 in a non-contact manner). An inspection signal including an AC component is applied to the probe 103.

An electrode 107 is disposed close to the end 106 of the pattern 101. A certain space 105 is formed between the electrode 107 and the end 106, and a capacitance C is defined by the space 105. An inductance L is connected in series with the electrode 107 and an output voltage at the inductance L is monitored.

When the frequency f of an input inspection signal is selectively set in a value $f_0$ which does not allow a distributed constant circuit to be formed in the board as an inspection object, the inductance L is selectively set to satisfy the following formula for a condition for obtaining reduced circuit impedance as with the equation (2).

$$L=(1/4\pi^2) \times f_0^2 \times C \quad (3)$$

Figure 4:
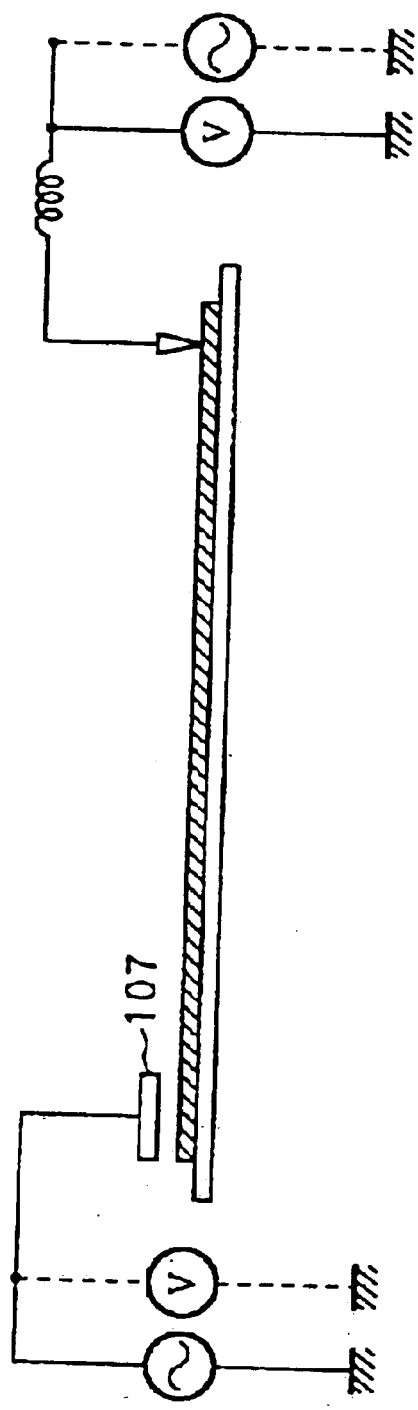
FIG. 4 illustrates a theoretical construction of an inspection apparatus according to another embodiment of the present invention.

It is not essential whether the inductance L is provided on the side of the electrode 107 as shown in FIG. 3 or on the side of the pin probe 103. Thus, in FIG. 3, the inductance L may be provided between the pin probe 103 and an AC power source 104. Moreover, in FIG. 3, the electrode 107 may be shifted to the side of the AC power source. As shown in FIG. 4, in such the modified examples of the embodiment, the electrode 107 is shifted to the side of the AC power source. In the modified example of FIG. 4, the capacitance C and the inductance L are also connected in series with each other, and thereby the formula (2) or (3) can be used as the condition for obtaining reduced impedance.

Figure 5:
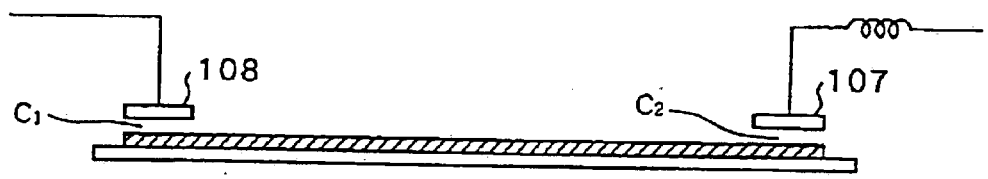
FIG. 5 illustrates a theoretical construction of an inspection apparatus according to still another embodiment of the present invention.

As shown in FIG. 5, in another modified example of the embodiment, an electrode 108 (coupling capacitance $C_1$) is additionally provided on the side of the pin probe of the embodiment shown in FIG. 3. Given that the coupling capacitance of the electrode 107 is $C_2$, the inductance L is selected according to the following formula in consideration of combined capacitance.

$$L=(1/4\pi^2) \times f_0^2 \times [(C_1 C_2)/(C_1+C_2)] \quad (4)$$

The combined capacitance ($C_1 C_2$)/($C_1+C_2$) is reduced in proportion to each of the capacitance ($C_1$, $C_2$). Thus, in the embodiment of FIG. 5, while it is require to provide a higher working frequency f than that in the embodiment of FIG. 3 as long as the same inductance L is used, the effect of eliminating the need for a high positioning accuracy can also be obtained in the side of the electrode 108.

In embodiments of FIGS. 4 and 5, the input side of the inspection signal and the monitor side of the output signal can be selectively disposed at either of the ends of the pattern wire.

An operative example of the above embodiments will be described in detail below.

This example is an inspection apparatus for inspecting a circuit board formed with a plurality of fine-pitch pattern wires thereon.

Figure 6:
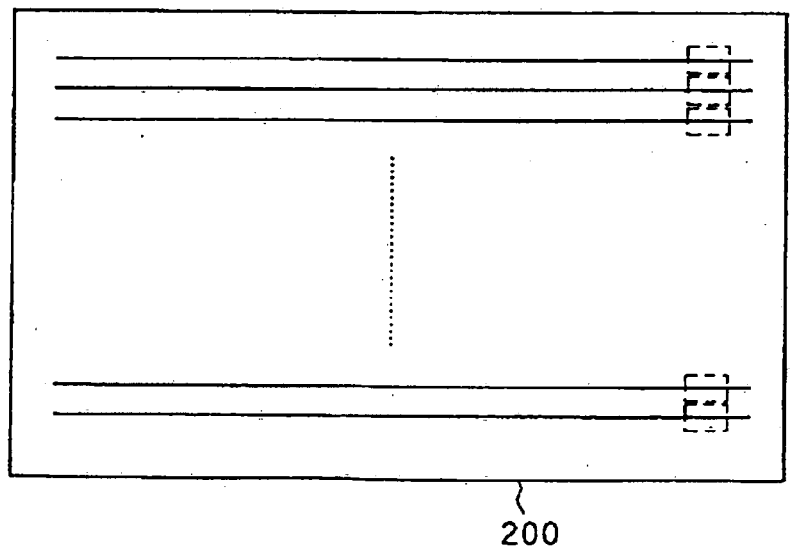
FIG. 6 is an exterior top view an exemplary board as an inspection object, which is used in an inspection apparatus according to an embodiment of the present invention.

FIG. 6 shows one example of a circuit board 200 as an inspection object. More specifically, a plurality of pattern wires are provided distributedly on the circuit board 200, and an inspection apparatus of this example is directed to inspect electrical continuity of each of the pattern wires. The board 200 is formed with the pattern wires each extending from the left side to the right side in the figure. On the left side of the board, a pitch between each pair of the pattern wires adjacent to each other is arranged to allow a pin probe to be set up adequately. On the right side of the board 200, a pitch between each pair of the pattern wires adjacent to each other is arranged to avoid any confliction between two electrodes for the pair of the pattern wires.

Figure 7:
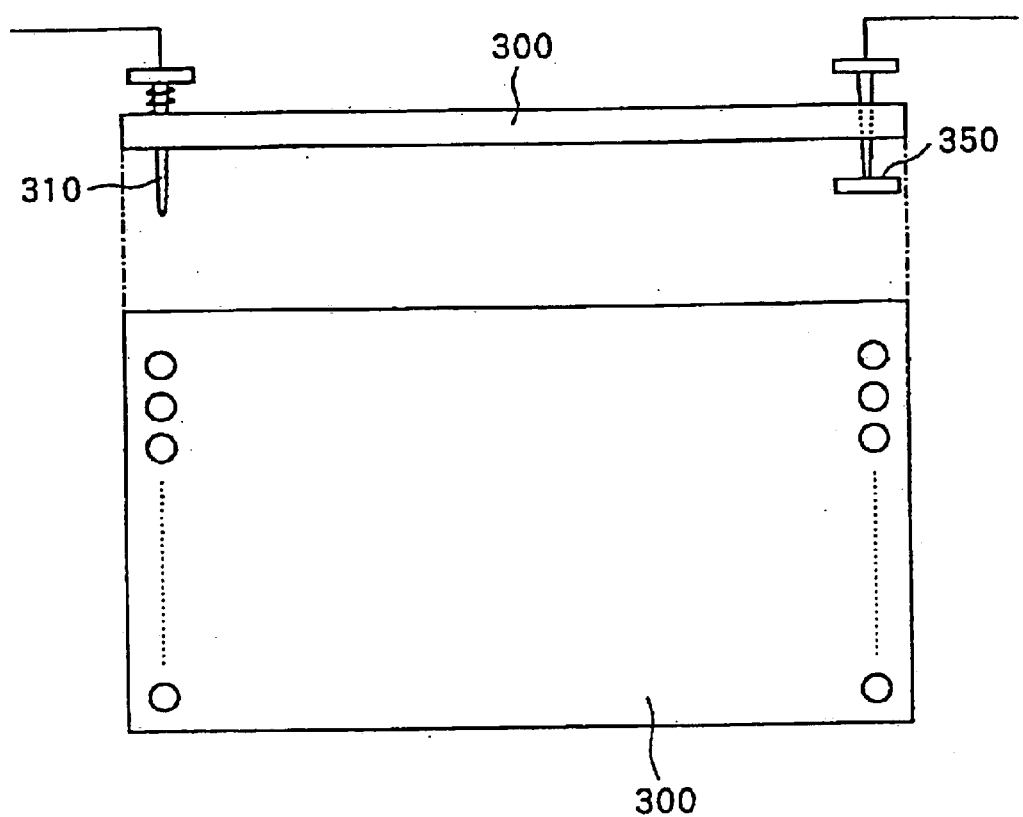
FIG. 7 is exterior views, including side and top views, of a jig used in an inspection apparatus according to an embodiment of the present invention.

FIG. 7 shows an example of a jig 300 fabricated dedicatedly for the circuit board 200 of FIG. 6. The dedicated jig is necessary because of the variation of the board as an inspection object. That is, each shape and pitch of pattern wires is varied for each board, and thereby the criterion for the availability of pin probes and electrodes to each of the pattern wires will be varied for each board. If any pin probe cannot be arranged on the input side of an inspection signal, it is forced to use the technique of FIG. 5. If any electrode cannot be arranged for each of the pattern wires, it is forced to use a technique of providing a common electrode for several of the pattern wires. As a result, each number and location of pin probes and each number and location of electrodes are inevitably changed in a thousand different ways. Thus, in view of operating efficiency, the dedicated jig is used with the board.

Referring to FIG. 7, the body of the jig 300 is made, for example, of an acrylic plate and fabricated in conformity with the shape of the board 200 as an inspection object. In the body of the dedicated jig 300 for the board 200 in the example of FIG. 6, a plurality of pin probes 310 each biased by a spring (each tip of the pin probes is acuminated within the level capable of avoiding any damage to the board) are provided on the left side of the jig 300. On the right side of the jig, electrodes 350 for each of the pattern wires are arranged at given positions, respectively. Lead wires are connected to the pin probes 310 and electrodes 350, respectively.

Figure 8:
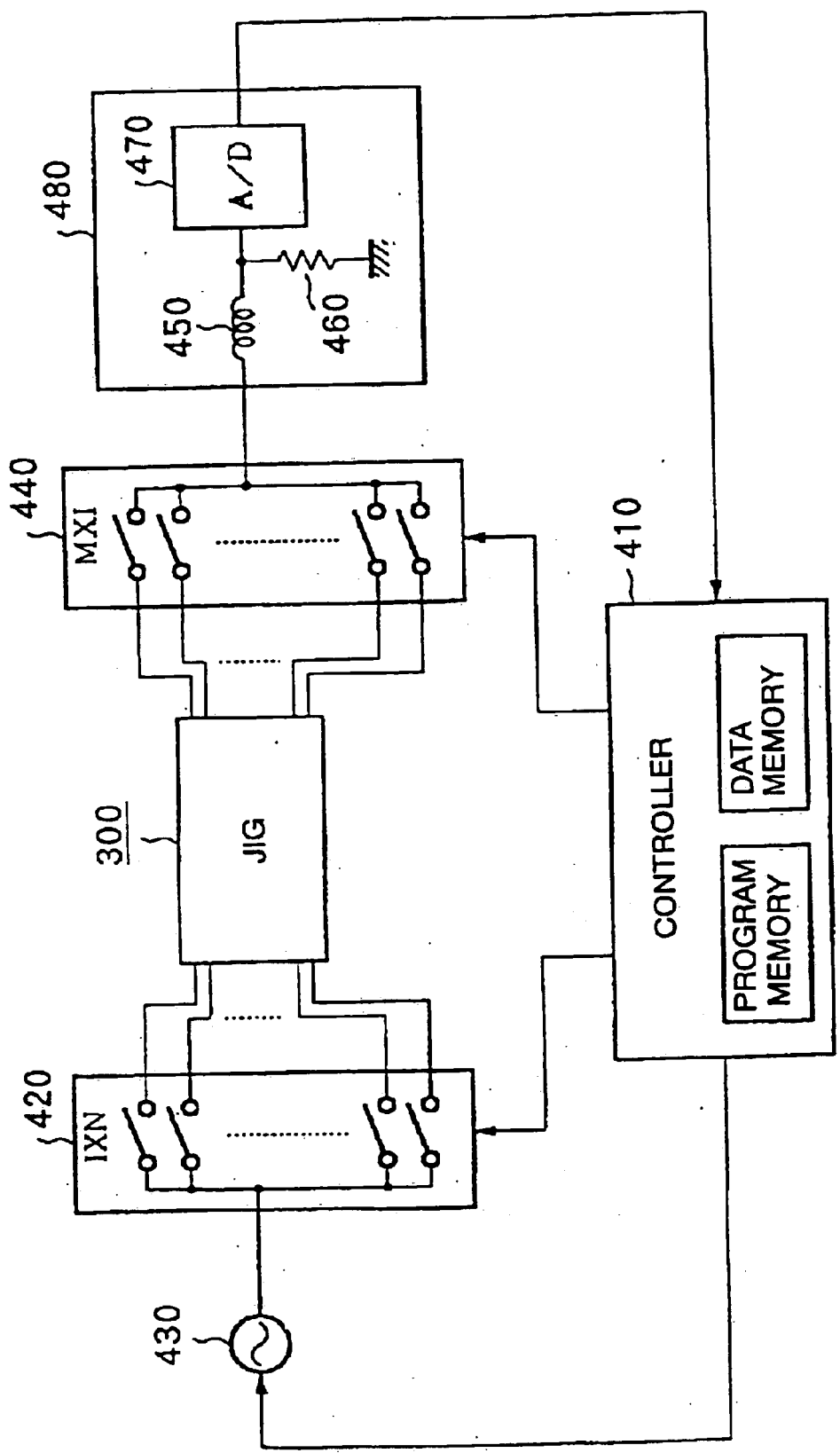
FIG. 8 is a system block diagram of an inspection apparatus according to an embodiment of the present invention.

FIG. 8 is a block diagram showing an inspection system 400.

This inspection system 400 is an example employing the jig 300 as described above. A controller 410 controls an overall sequence and control process of this system. More specifically, the controller 410 controls a circuit 430 for generating an inspection signal, a 1:N multiplexer, an M:1 multiplexer, and an adapter 480 comprising an inductance 450, a resistance 460 and an A/D converter 470.

The system shown in FIG. 8 is directed to the circuit board of FIG. 6. Thus, inspection signals are input into the multiplexer 420, and then the multiplexer 420 distributes the inspection signals to N analog switches. The number N of the analog switches should be equal to the number of the pin probes on the board 200. The multiplexer 440 selects either one of M outputs from the M analog switches (the number M is equal to the number of the pin probes for output, and typically M=N), and outputs to the adapter 480.

The adapter 480 is detachable to provide a specific inductance 450 and specific resistance 460 for the board 200 as an inspection object.

Figure 9:
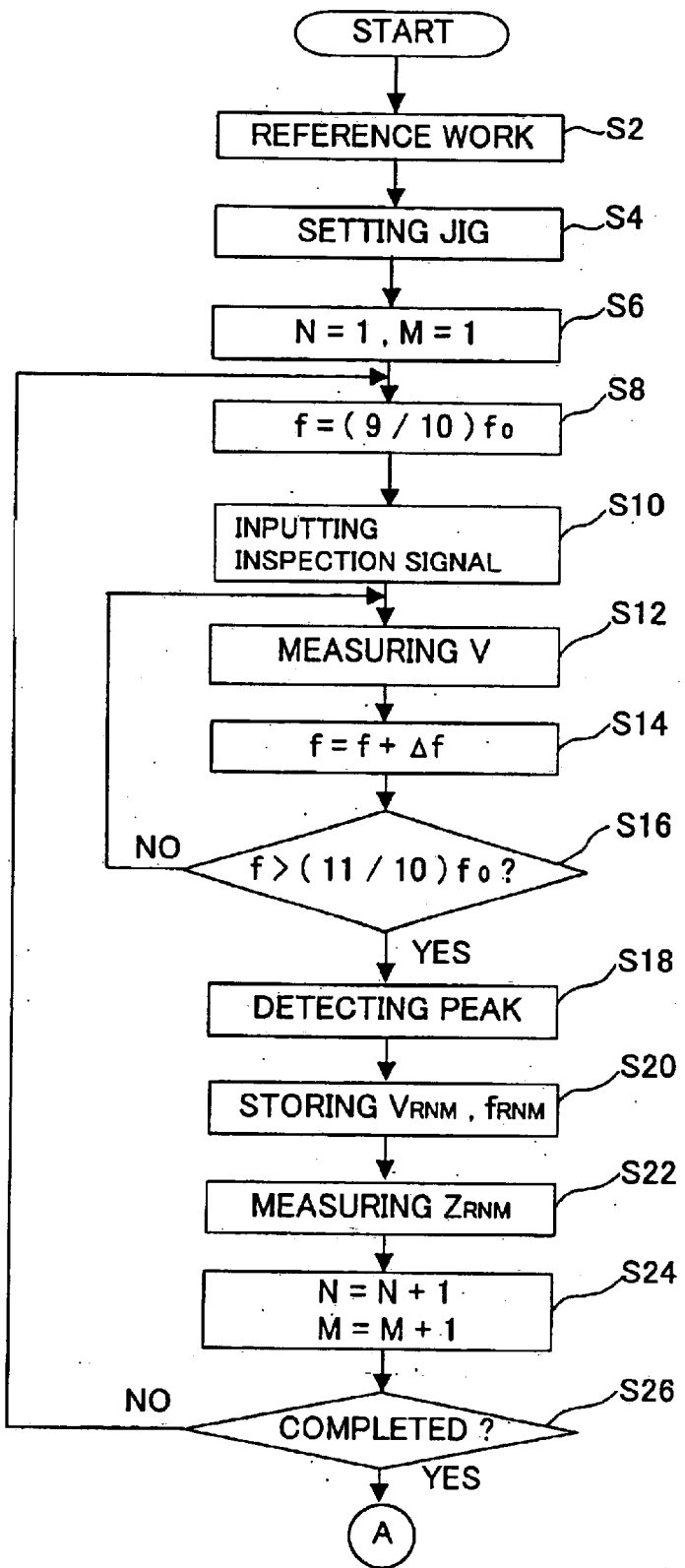
FIG. 9 is an explanatory flow chart of a general control process in an inspection apparatus according to an embodiment of the present invention.
Figure 10:
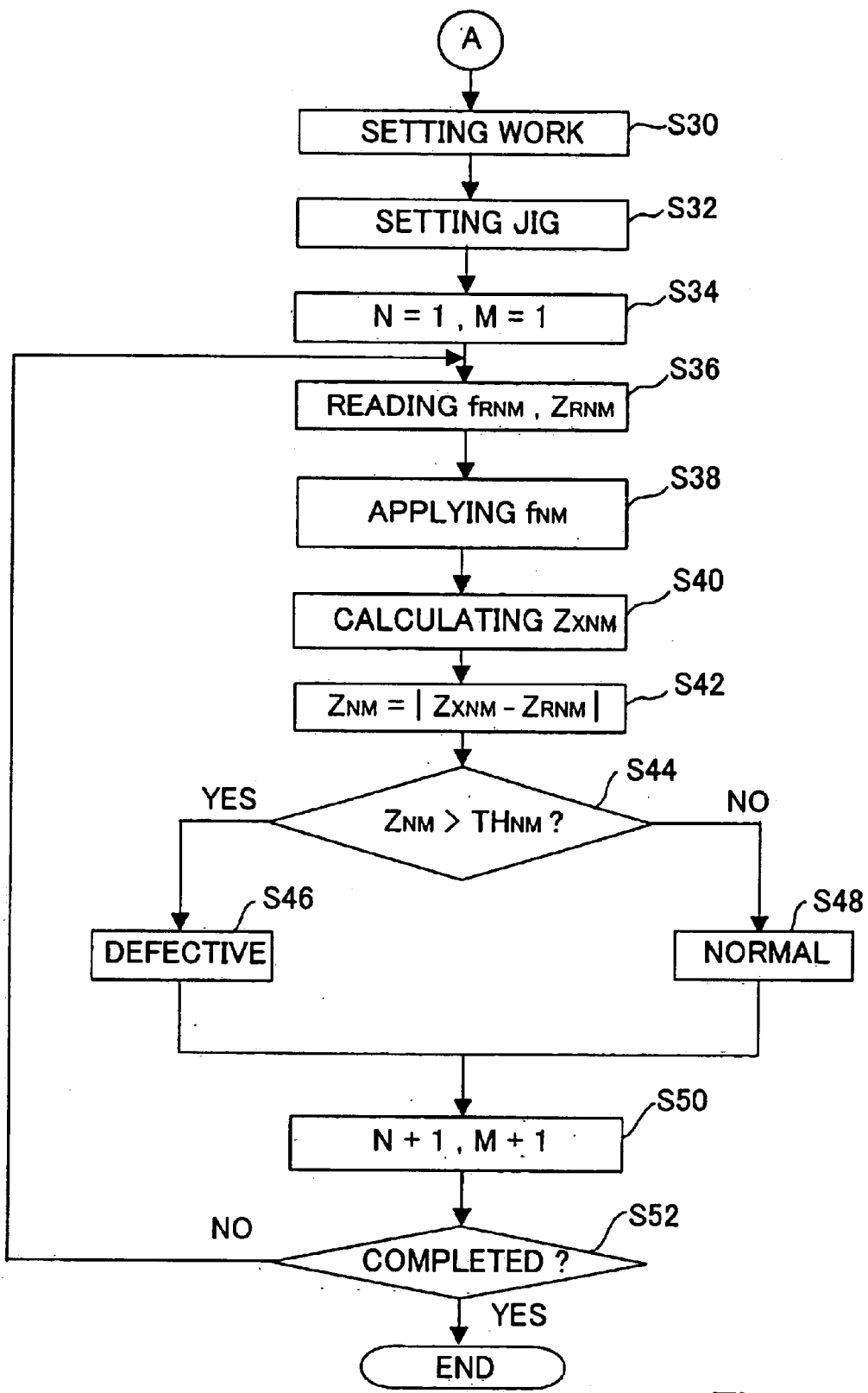
FIG. 10 is an explanatory flow chart of a general control process in an inspection apparatus according to an embodiment of the present invention.

Referring to FIGS. 9 and 10, the control process of this inspection system will be described. According to this control process, a reference work (in which no disconnection or the like has been verified) is measured to determine the impedance or the like of each of pattern wires on the reference work (the control process shown in FIG. 9), and the impedance of a work as an inspection object is measured, followed by comparing the measured impedance of the inspected work with the measured impedance of the reference work, so as to detect a defective portion (disconnection and half-short) (and to eliminate the defective board based on the detection) (FIG. 10).

in Step S2 of FIG. 9, the reference work is set up. In Step S4, the jig 300 is set up to the reference work. By this setting, the plurality of electrodes provided in the jig are disposed close to one end of the pattern as an inspection object in a non-contact manner. In Step S6, counters N and M in are initialized to 1.

in Step S8, the frequency of the inspection signal from the oscillator 430 is set at −10% of the reference frequency $f_0$, i.e. at $(1-1/10) \cdot f_0 = (9/10) \cdot f_0$. In Step S10, the multiplexers 420 and 440 are set up to apply the inspection signal having the frequency $f_0$ to the pattern wires selected by the counters N and M. At this moment, only the analog switch designated by the counter N is turn on, and the other switches are shunted to the ground side. In the multiplexer 440, only the analog switch designated by the counter M is turn on, the other switches are shunted to the ground side. Thus, the N-th analog switch is turn on. Then, the inspection signal is applied to the pattern wire designated by the values N and M, and an output signal of the wire is input into the adapter 480 through the M-th analog switch of the multiplexer 440.

In Step S12, the output signal $V_{NM}$ of the pattern wire NM detected by the adapter 480 is measured and stored in a given memory of the controller 410.

Figure 11:
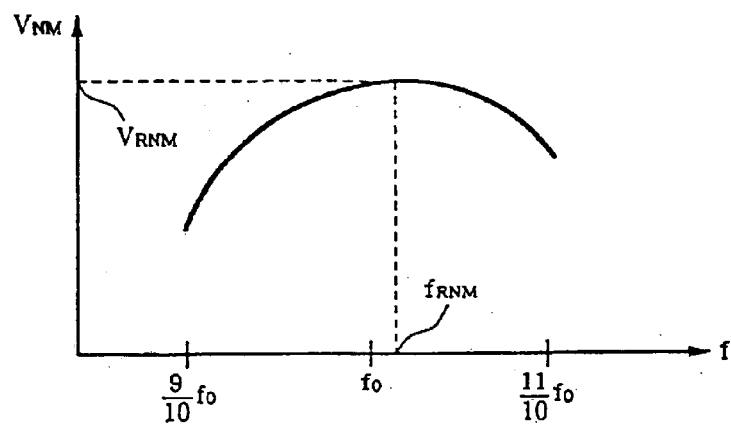
FIG. 11 is an explanatory graph of a peak search operation in an inspection apparatus according to an embodiment of the present invention.

In Step S14, the frequency of the inspection signal is increased by $\Delta f$. Using the inspection signal having this increased frequency, the output voltage is measured in Step S12. In Step S16, this operation is repeated until the frequency f exceeds $11/10 \cdot f_0$. As shown in FIG. 11, a plurality of measured values $V_{NM}$ obtained by repeating Steps S12 through S16 would include a peak value. At this moment, the output signal value and frequency are stored in the memory of the controller as $V_{RNM}$ (the subscript R represents "reference") and $f_{RNM}$, respectively. In Step S22, the impedance $Z_{RNM}$ of a current path NM of interest is determined from the reference output signal value $V_{RNM}$.

For any pattern wire NM, a combination of the reference frequency $f_{RNM}$ giving the reference output signal value $V_{RNM}$ and the impedance $Z_{RNM}$ of the current path NM could be obtained by repeating the operation of the Steps S8 through S24. These data are stored in a memory as a set and can be fetched from the memory by using NM as an argument.

In accordance with a first control process, the work as an inspection object is measured.

More specifically, in Step S30, the work as an inspection object is set up. In Step S32, the jig is set up to this work. In Step S34, the counters N and M are initialized. In Step S36, the combination of the reference frequency $f_{RNM}$ and the reference impedance $Z_{RNM}$ is read from the aforementioned memory. In Step S38, the inspection signal having the reference frequency $f_{RNM}$ is applied to an NM pattern wire of the board as an inspection object. In Step S49, the impedance $Z_{XNM}$ of a current path NM is calculated by measuring the output signal $V_{NM}$ from the pattern wire. In Step S42, the impedance $Z_{NM}$ of the work is calculated based on the following formula.

$$Z_{NM} = |Z_{XNM} \, Z_{RNM}|$$

In Step S44, it is judged whether the impedance ZNM calculated in Step S42 exceeds a given threshold value $TH_{NM}$. When the impedance exceeds the threshold value to a large extent, the current path NM is judged as defective (Step S46). When the impedance does not exceed the threshold value, the current path NM is judged as normal.

In Steps S36 through S52, the above judgment is performed for all of the current paths. In the judgment of normal/defective for the board, if only one of the current paths is defective (but not limited to this), the board is judged as defective.

<Another Embodiment>

Figure 13:
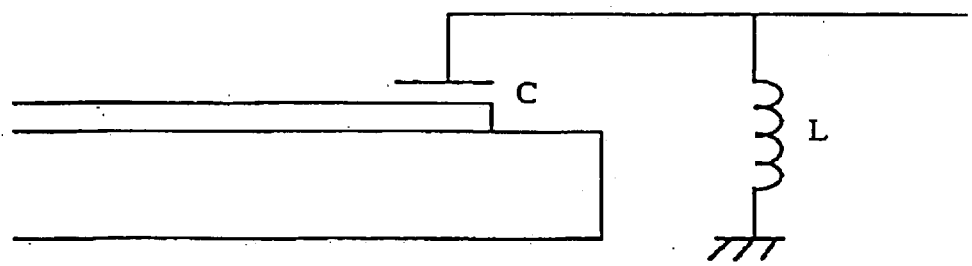
FIG. 13 illustrates a connective relationship between an inductive element L and a coupling capacitance C according to another embodiment.

While the coil (L) as an inductive element in the above embodiment is connected in series with the coupling capacitance (C) formed between the electrode and the circuit board as shown in FIG. 3 and other, the coil L may be connected in parallel with the capacitance C to measure the voltage between the capacitance C and the ground as shown in FIG. 13. This connecting manner can provide enhanced resonance intensity, and allows the control process of FIGS. 9 and 10 to be employed in the system construction of FIG. 8 substantially having no modification.

In this case, a resistance for detecting current is removed to increase the resonance intensity. Moreover, as with the above embodiment, the correlation between the output voltage and resistance value in various current paths is determined in advance by using the reference board.

<Operative Example of Sensor>

Figure 14:
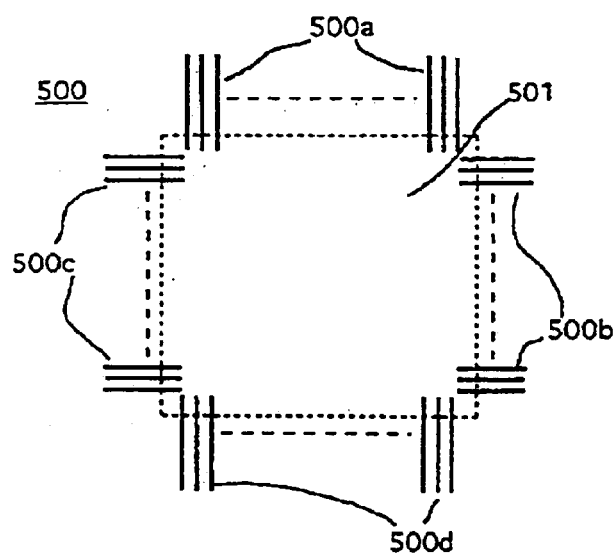
FIG. 14 illustrates an operative example of a board as an inspection object.

While each shape of the sensors shown in FIGS. 5 and 6 is conceptualized, the shape of the sensor electrode is actually preferable to be coordinated with the shape of the path pattern as an inspection object. FIG. 14 shows one example of a circuit board 500 as an inspection object.

In FIG. 14, the reference number 501 defined by a dashed line indicates an electronic device (LSI, etc.) to be mounted on the board as an intending inspection object. The board 500 is provided thereon with path patterns 500a, 500b, 500d and 500e to which input and output pins (not shown) of the electronic device 501 are connected in the future.

Figure 15:
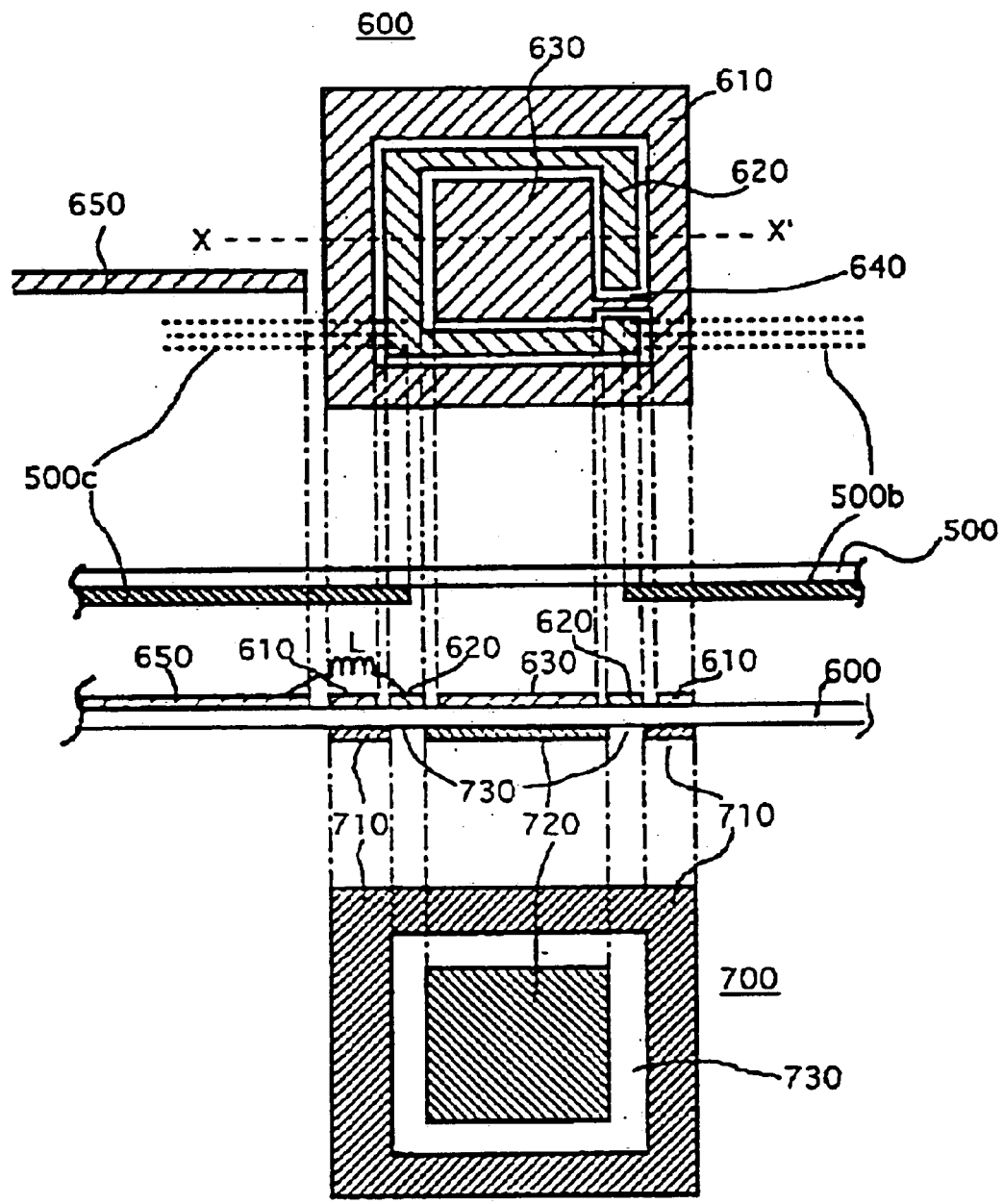
FIG. 15 is a block diagram, including front and sectional-side views, of a sensor electrode plate for inspecting the board of FIG. 14.

FIG. 15 shows a sensor assembly 600 for inspecting the above path patterns 500a, 500b, 500d and 500e. More specifically, in FIG. 15, a sensor electrode plate itself is a conductive plate 620 having a square-ring shape with a partial cutout. The conductive plate 620 is surrounded by a ground electrode plate 610. Further, the inside portion of the square-ring-shaped sensor electrode plate 620 is cut out, and a ground electrode plate 630 is also formed within this inside cutout. The square-ring-shaped sensor electrode plate 620 has the partial cutout 640 to be formed in a C shape. The cutout 640 defines a wire path for connecting the ground electrode plate 610 with the ground electrode plate 630 so as to keep each ground potential of the ground electrode plates 610 and 630 in the same level. Thus, the sensor electrode plate 620 is sandwiched between the ground electrode plates 610 and 630 acting as a shield.

As shown in FIG. 15, a coil L is arranged between the sensor electrode plate 620 and an output terminal wire 650.

The above sensor assembler 600 is disposed close to the surface of the circuit board 500 as an inspection object having the pattern paths 500a, 500b, 500d and 500e thereon. In the example of FIG. 15, since the pattern paths 500a, 500b, 500d and 500e are provided on the under surface of the circuit board 500, the sensor assembler 600 is moved toward the lower side of FIG. 15. The reference number 700 in FIG. 15 is a shield plate provided on the opposite side (the under side in the example of FIG. 15) with respect to the surface having the sensor electrode in the board of the sensor assembler 600. While the shield plate 700 has substantially the same size as that of the ground electrode plate 610 of the sensor, a cutout 730 is formed in the shield plate as shown in the same figure. The cutout 730 substantially corresponds with the pattern of the sensor electrode plate 620. That is, on the same surface as that of the sensor electrode plate 620, a shielding effect is created by sandwiching the sensor electrode plate 620 between the ground electrode plates 610 and 630. On the other surface, an S/N ratio can be improved by providing shield plates 710 and 720 correspondingly to the ground electrode plates 610 and 630 and providing no shield plate correspondingly to the sensor electrode plate 620.

The sensor electrode plate 620 is formed in approximately square-ring shape (or C shape) because plural ends of path patterns 500a, 500b, 500d and 500e is aligned to form a square-ring side on the board as an inspection object. Thus, when the shape defined by the distribution of the ends of the path patterns as an inspection object is randomly changed, the shape of the sensor electrode plate will be formed correspondingly to the distribution shape. For example, when the plural ends of the path patterns 500a, 500b, 500d and 500e are generally distributed along each side of a triangle, the sensor electrode plate may have a band or ribbon shape which has a width capable of assuring a desired coupling capacitance C and extends along each side of the triangle.

<Design Process of inspection System>

As is apparent from the description of the above embodiment, this inspection system is focused on generating a resonance state to reduce the impedance of the entire circuit so as to provide increased output voltage. In order to generate a resonance state, it is required to satisfy a given condition. Possible factor having an affect on the condition includes:

Coupling Capacitance C (i.e. the wire width of the path pattern, the area and width of the sensor electrode plate, and the distance between the pattern and the electrode);

Inductive Constant L; and

Applied Frequency f.

Changing the frequency f can be readily achieved electrically and electronically, and is thereby suitable to search a resonance point. However, the value of the coupling capacitance C is typically small. This can provide a resonance state at a high frequency. The high resonance point causes an unstable operation of the entire inspection system and a signal leak. Thus, it is undesirable to use excessively high frequency f.

Generally, in the path pattern wire of the board as an inspection object, its width and/or length having an affect on the coupling capacitance C are not allowed to change. Thus, the system design process to be proposed is:

I. the sensor electrode is first designed so as to provide the coupling capacitance C falling within the rang of about 50 fF to about 1 pF, in consideration of the width and/or length of the path pattern wire of the board as an inspection object as well as the size and area of the sensor electrode;

II. the value of the inductive element L is then determined so as to provide the resonance frequency or the reference frequency of an oscillator falling within the rang of 5 MHz to 10 MHz. According to an experimental knowledge, the value of the inductive element is desirable to be in the range of 20 mH to 25 mH.

An inspection system designed by the above design process provides a desired stability at high frequency as a whole, and allows an optimum resonance point to be readily found.

<Modified Example>

M-1: Any inspection principles or theories of the first to third embodiments are applicable to any inspection system in the above embodiments.

M-2: in the above example, for determining the reference frequency by use of a reference work, the frequency has been varied in the range of ±10% (hereinafter referred to as "±δf") of the standard frequency $f_0$ to detect the peak. However, the variable range δf is not limited to such a specific example.

For example, when the reference frequency is changed in a wide range because of successively measuring various different boards as an inspection object, it is required to expand the variable range ±δf for the peak searching. That is, when it is intended to successively measure a plurality of different board or a single of board including a plurality of pattern wires having significantly different reference frequencies each other, it is required to expand the variable range ±δf in advance. However, the variable range should be reasonably determined in consideration of the fact that the expanded variable range ±δf causes increased time for the inspection.

M-3: While the electrodes in the above embodiment have been provided for each of the plural current paths (pattern wires), the present invention is not limited to this specific embodiment. Particularly, when each pitch between the pattern wires on the output side is narrow, it is required to provide a common electrode for some of the plural pattern wires. This allows the number of the electrodes to be reduced, which lowers the need for positioning the jig with a high degree of accuracy.

Figure 12:
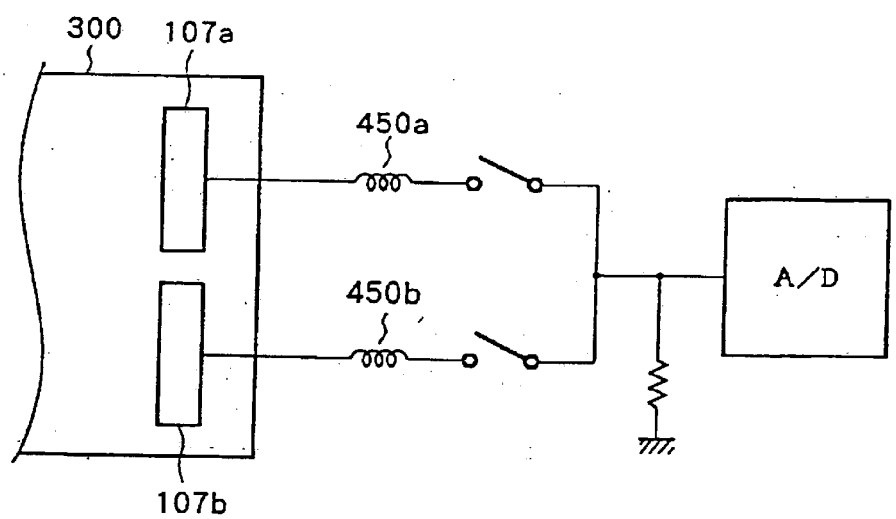
FIG. 12 is a block diagram showing a partial construction of an inspection apparatus according to a modified example of the embodiments.

FIG. 12 shows a construction in case of inspecting all pattern wires of a single board as an inspection object by use of two electrodes 107a and 107b. In this case, it is necessary to allocate one of the analog switches for each of the electrodes.

In the example of FIG. 12, since the reference frequency of a pattern wire covered by the electrode 107a is different from the reference frequency of a pattern wire covered by the electrode 107b, inductances 450a and 450b are provided for the electrodes, respectively. When it is expected that the reference frequencies have no significant difference, the number of the inductances may be cut to one. In case of allowing to use a single inductance, the inductance may be shifted from the position of FIG. 12 to the side of the adopter as with the abovementioned example.

M-4: The number of the inductances L depends on the working frequency f. When the frequency f is high, the inductance L is preferably disposed as close as possible to a board as an inspection object. In this case, it is required to provide a plurality of inductances each having the same value respectively to all lines of analog switches of a multiplexer 440.

M-5: While a resonance state has been generated by changing the frequency f in the above embodiments and examples, this invention is not limited to such specific embodiments and examples. For example, the coupling capacitance C or inductance L may be changed.

For example, when changing the inductance L, an inductance chip having a plurality of taps is provided in the adopter 480 or multiplexer 330, or connected directly in the vicinity of the electrode. The necessity for changing the coupling capacitance C arises from the fact that, for example, when each size of the electrodes is different, it is necessary to provide the same resonance frequency for each of plural pattern wires (plural current paths).

M-6: The value of the inductance L should be determined according to the frequency of an oscillator to be used. In the present invention, any impedance is essentially measured in a resonance state. As long as the resonance state is obtained, a desired measurement can be achieved by changing at least one of the frequency f, coupling capacitance C and inductance L. However, increasing the frequency undesirably results in increase leakage current in the entire circuit board and degraded accuracy of the measurement. Thus, in order to obtain the resonance state without increasing the resonance frequency, the value of the inductance L should be increased. In the above embodiment, the resonance frequency is set at about 5 MHz.

Moreover, the resonance state may be varied by changing the coupling capacitance. In this case, it is undesirable to change the coupling capacitance C by changing the size of the electrode. Thus, for example, only when a large size of electrode yields high coupling capacitance $C_0$ and excessive resonance, it is necessary to additionally provide an attenuating capacitor $C_x$ connected in series with the coupling capacitance $C_0$.

M-7: The above example has an assumption that the peak can be found during changing the frequency in the range of ±10% in Steps S12 through S16. Actually, there is the case that the peak cannot be found. Thus, it is proposed to modify the flow chart of FIG. 9 as follows:

in the first modified example, instead of detecting the peak, the frequency provided a maximum value n the range of ±10% is considered as the resonance point, and then this frequency is determined as the reference frequency; and in the second modified example, if the peak value or maximum value can not found, the Step S16 is modified to expand the variable range until the maximum value is found.

M-8: in the above example, the process for inspecting the work as an inspection object (FIG. 10) has employed the reference frequency $f_{RNM}$ obtained by using the reference work. This has done on the assumption that no displacement is caused when each of the reference work and the work as an actual inspection object is attached to the jig. However, it is actually difficult to avoid the displacement perfectly. In this case, if any correction for the displacement is left out of consideration, the increased impedance caused by the displacement (apparent increase) can be erroneously judged as the increased impedance caused by defective pattern wires. Thus, it is proposed to modify the control process as follows.

That is, the peak detecting process applied to the reference work is also applied to the inspection for the actual work. Specifically, similar steps to Steps S12 through S16 are substituted for Step S38 (FIG. 10). At this time, $f_0$ in Step S16 is substituted with $f_{RNM}$ read in Step S36. In other words, the peak frequency generating a resonance state is searched by changing the frequency in the range of ±10% (but not limited to the value ±10%) around $f_{RNM}$ as a center frequency. This modified example can provide an effective countermeasure for the displacement.

M-9: in the present invention, various shapes may be actually applied to the inductive element or inductance L. However, when the working frequency becomes relatively high, it is necessary to provide the inductance with an adequate consideration.

M-10: in the present invention, various shapes may be actually applied to the inductive element or inductance L having. However, when the working frequency becomes relatively high, it is necessary to mount the inductance with an adequate consideration. FIG. 13 shows a mounted state of a coil used as the inductance.

M-11: The inspection signal is not limited to a sine wave, and any suitable signal having an AC component, such as a pulse train and a single pulse, may be used.

INDUSTRIAL APPLICABILITY

As described above, an apparatus and method for inspecting electrical continuity of a circuit board of the present invention can generate a resonance state at a low frequency to achieve reduced circuit impedance. This provides enhanced SN ratio of an output signal, which enables to perform continuity inspections with a high degree of accuracy.

In particular, the non-contact system can be employed with allowing of using the contact system. Thus, the number of probes may be reduced, which contributes sufficiently to cost reduction.

Moreover, electrical continuity under a low resistance value, such as a value ranging from about 10 to 100Ω, could also be measured.

What is claimed is:

1. A continuity inspection apparatus for inspecting electrical continuity between first and second terminals of a pattern wire formed on a board, said continuity inspection apparatus comprising:

capacitive coupling means to be capacitively coupled with said first terminal in a non-contact manner to provide a coupling capacitance therebetween;

an inductive element connected to said capacitive coupling means to form a resonance circuit in conjunction with the capacitance yielded by said capacitive coupling means in order to inspect said electrical continuity under a low resistance;

a first lead wire connected to said inductive element;

probe means connected to a second lead wire and to be contacted with said second terminal;

signal inputting means for inputting an inspection signal including an AC component into one of said first and second lead wires; and signal detecting means for detecting an output of said inspection signal at the other of said first and second lead wires.

2. A continuity inspection apparatus as defined in claim 1, wherein said probe means includes a probe connected to said second lead wire, said probe connected directly and detachably to said second terminal in the form of a resistance.

3. A continuity inspection apparatus as defined in either one of claim 1 or 2, wherein said inspection signal is an AC signal.

4. A continuity inspection apparatus as defined in either one of claim 1 or 2, wherein said inspection signal is a pulse signal.

5. A continuity inspection apparatus as defined in claim 1, wherein said board includes a plurality of pattern wires formed thereon, said pattern wires each having first and second terminal groups, wherein said continuity inspection apparatus further includes selecting means for selecting said first terminal from said first terminal group to connect said selected first terminal to said inductive element.

6. A continuity inspection apparatus as defined in claim 5, wherein said selecting means is a multiplexer circuit including a plurality of analog switches.

7. A continuity inspection apparatus as defined in claim 6, wherein said multiplexer further includes a switch for grounding an output of said terminal which is not selected.

8. A continuity inspection apparatus as defined in claim 1, wherein said board includes a plurality of pattern wires formed thereon, said pattern wires each having first and second terminal groups, wherein said continuity inspection apparatus further includes selecting means for selecting said second terminal from said second terminal group to connect said selected second terminal to said second lead wire.

9. A continuity inspection apparatus as defined in claim 8, wherein said selecting means is a multiplexer circuit including a plurality of analog switches.

10. A continuity inspection apparatus as defined in claim 9, wherein said multiplexer further includes a switch for grounding an output of said terminal which is not selected.

11. A continuity inspection method for inspecting electrical continuity between first and second terminals of a pattern wire formed on a board, said continuity inspection method comprising steps of:

positioning a given electrode close to said first terminal to form a coupling capacitance, and connecting a given inductive element to said electrode, followed by connecting a first lead wire to said inductive element and connecting a second lead wire to said second terminal, so as to form a resonance circuit by said first lead wire, inductive element, electrode, coupling capacitance, first terminal, pattern wire, second terminal and second lead wire in order to inspect said electrical continuity under a low resistance;

applying an inspection signal including an AC component to one of said first and second lead wires; and detecting an output of said inspection signal at the other of said first and second lead wires.

12. A continuity inspection method as defined in claim 11, wherein said inspection signal is an AC signal.

13. A continuity inspection method as defined in claim 11, wherein said inspection signal is a pulse signal.

14. A continuity inspection method as defined in claim 11, which further includes steps of:

forming a plurality of pattern wires on said board, said pattern wires each having first and second terminal groups; and selecting said first terminal from said first terminal group to connect said selected first terminal to said inductive element.

15. A continuity inspection method as defined in claim 11, which further includes step of:

previous to said step of applying an inspection signal, determining a resonance frequency for a pattern wire between first and second terminals of a given reference board by applying an inspection signal to said reference board while changing the frequency of said inspection signal; and in said step of applying an inspection signal, applying said inspection signal to one of said first and second lead wires with using said determined resonance frequency as a frequency thereof.

16. A continuity inspection method as defined in claim 11, which further includes step of:

in said step of determining a resonance frequency, changing the frequency of said inspection signal for said reference board within a given range having a center frequency defined by a standard frequency determined based on the constant of said inductive element.

17. A continuity inspection method as defined in claim 11, which further includes step of:

in said step of applying an inspecting signal, changing the frequency of said inspection signal for said board as an inspection object within a given range having a center frequency defined by the frequency determined in said step of determining a resonance frequency.

18. A continuity inspection apparatus as defined in any one of claim 1 or 2, which further includes means for changing the frequency of said inspection signal.

19. A computer-readable record medium storing thereon a computer program which achieves a continuity inspection method as defined in either one of claim 11.

20. A continuity inspection apparatus for inspecting electrical continuity between first and second terminals of a pattern wire formed densely on a board, said continuity inspection apparatus comprising:

a sensor electrode having a dimensional size so as to provide a coupling capacitance falling within the range of 50 fF to 1 pF with said pattern wire;

an inductive element connected in parallel or series with said sensor electrode, to form a resonance circuit said inductive element having a constant ranging from 20 mH to 25 μH in order to inspect said electrical continuity under a low resistance; and an oscillator oscillating at a reference frequency falling within the rang of 5 MHz to 10 MHz, said oscillator being adapted to change the frequency thereof in a given range from said reference frequency.

21. A continuity inspection apparatus as defined in claim 1 or 20, wherein said low resistance ranges from about 10Ω to about 100Ω.

22. A continuity inspection method as defined in claim 11, wherein said low resistance ranges from about 10Ω to about 100Ω.

* * * * *